United States Patent
Höfs et al.

(10) Patent No.: US 6,937,682 B2
(45) Date of Patent: Aug. 30, 2005

(54) CLOCK-PULSE SUPPLY UNIT

(75) Inventors: Henning Höfs, Langenhagen (DE); Norbert Puschmann, Garbsen (DE)

(73) Assignee: Alcatel, Paris (FR)

( * ) Notice: Subject to any disclaimer, the term of this patent is extended or adjusted under 35 U.S.C. 154(b) by 733 days.

(21) Appl. No.: 09/915,284

(22) Filed: Jul. 27, 2001

(65) Prior Publication Data

US 2002/0054656 A1 May 9, 2002

(30) Foreign Application Priority Data

Jul. 28, 2000 (DE) .......................................... 100 36 827

(51) Int. Cl.⁷ .............................. H03D 3/24; H04L 7/02
(52) U.S. Cl. ....................... 375/375; 375/360; 375/357; 375/373; 370/217
(58) Field of Search ................................ 375/375, 354, 375/360, 357, 376, 373; 327/144, 146, 141; 713/400; 348/506; 370/217

(56) References Cited

U.S. PATENT DOCUMENTS

| | | | |
|---|---|---|---|
| 5,025,310 A | * 6/1991 | Sekiya et al. | ............... 348/506 |
| 5,442,776 A | * 8/1995 | Masleid et al. | ............. 713/503 |
| 5,619,158 A | * 4/1997 | Casal et al. | .................. 327/292 |
| 5,748,569 A | 5/1998 | Teodorescu et al. | |
| 6,411,665 B1 | * 6/2002 | Chan et al. | .................. 375/360 |
| 6,760,392 B1 | * 7/2004 | Tan et al. | .................... 375/354 |

FOREIGN PATENT DOCUMENTS

EP 652 642 A1 5/1995

OTHER PUBLICATIONS

Patent Abstracts of Japan Bd. 1999, Nr. 10, Aug. 31, 1999—JP 11 136633 Victor Co of Japan, Ltd., May 21, 1999.

* cited by examiner

*Primary Examiner*—Amanda T. Le
*Assistant Examiner*—Cicely Ware
(74) *Attorney, Agent, or Firm*—Sughrue Mion, PLLC

(57) ABSTRACT

In a clock-pulse supply unit, a first receiver unit is used to tap a central system clock pulse from the back panel. A time delay occurs in the first receiver unit. In order to compensate this time delay, a second receiver unit is used which is identical in construction to the first receiver unit and has the same time delay as the first receiver unit. A redundant clock pulse is supplied to the second receiver unit and thereby undergoes the same time delay as the central system clock pulse in the first receiver unit. The central system clock pulse and the redundant clock pulse can then be accurately compared with one another in a phase detector. The redundant clock pulse is then synchronized to the central clock pulse. The switchover from a slave clock pulse to the redundant clock pulse is effected only when synchronization is completed. This means that, in the event of disturbance of the slave clock pulse, the redundant clock pulse is synchronized to the disturbed clock pulse prior to the switchover and switchover is effected only when synchronization is completed. This has the advantage that no phase jump occurs at the instant of switchover.

8 Claims, 1 Drawing Sheet

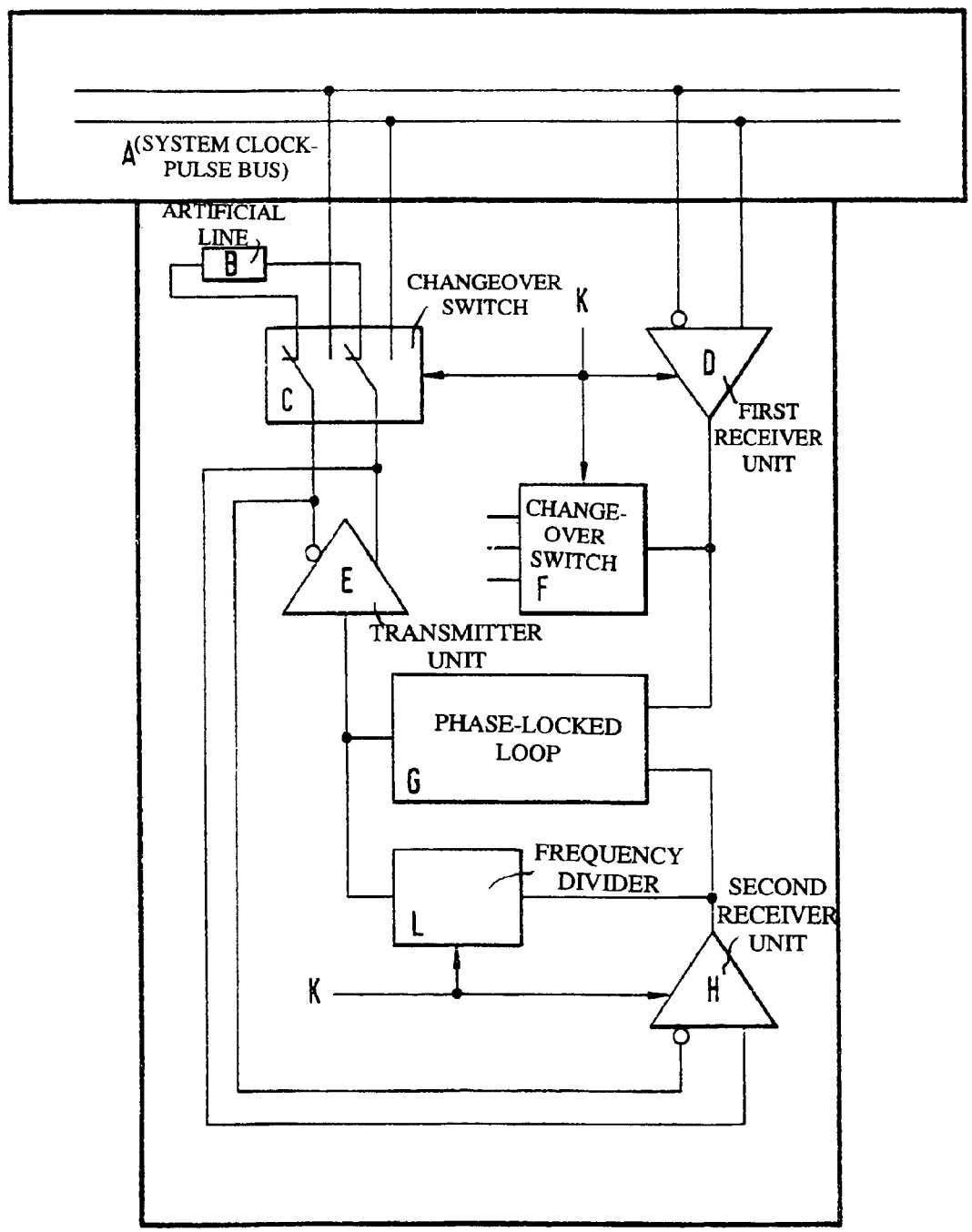

CLOCK-PULSE SUPPLY UNIT

TECHNICAL FIELD

The invention concerns a clock-pulse supply unit.

The invention is based on a priority application DE 100 36 827.1 which is hereby incorporated by reference.

BACKGROUND OF THE INVENTION

In digital transmission systems, for the purpose of supplying the clock pulse there is generated in a control centre a master clock pulse which is transmitted via the digital transmission system to local digital transmission facilities. In each of the digital transmission facilities, a local slave clock pulse is generated which is synchronized to the received master clock pulse. The digital transmission facilities, e.g., data transmission facilities, are predominantly accommodated in subracks which have a central clock-pulse supply unit. The clock-pulse supply unit generates the slave clock pulse which is used as a central system clock pulse and, in a synchronous system, via the back panel which comprises a bus for system clock-pulse distribution, distributes it to all function units accommodated in the subracks.

If the functioning of the central clock-pulse supply is impaired or fails, this can affect the entire data transmission facility. For this reason, there is a change towards redundancy in the construction of the clock-pulse supply unit of the subracks. This means that a redundant clock pulse, which is non-dependent on the slave clock pulse, is generated locally through a second clock-pulse supply unit. If there is disturbance of the slave clock pulse it is possible to switch over to the redundant clock pulse. The redundant clock pulse is then the new slave clock pulse which assumes the function of supplying the clock pulse to the subracks. The switchover to the redundant clock pulse can be effected autonomously by the clock-pulse supply units or administratively, from the control centre.

The switchover can result in an interruption of a connection existing at that instant, e.g. a telephone connection, which can mean the loss of data. It is necessary to resynchronize the redundant clock pulse to the master clock pulse. This requires time. The interrupted connection must be re-established.

SUMMARY OF THE INVENTION

The object of the invention is to create a clock-pulse supply unit in which, as far as possible, there is no impairment of the transmission system upon the switchover from the slave clock pulse to the redundant clock pulse.

This object is achieved by a clock-pulse supply unit comprising a phase detector for comparing the phase of a first clock pulse with the phase of a second clock pulse, a first receiver unit for receiving the first clock pulse and relaying the first clock pulse to the phase detector, and a second receiver unit which has the same parameters as the first receiver unit and serves to receive the second clock pulse and relay the second clock pulse to the phase detector.

A first receiver unit is used to tap the central system clock pulse from the back panel. A time delay occurs in the first receiver unit. In order to compensate this time delay, a second receiver unit is used which is identical in construction to the first receiver unit and has the same time delay as the first receiver unit. The redundant clock pulse is supplied to the second receiver unit and thereby undergoes the same time delay as the central system clock pulse in the first receiver unit. The central system clock pulse and the redundant clock pulse can then be accurately compared with one another in a phase detector. The redundant clock pulse is then synchronized to the central clock pulse. The switchover from the slave clock pulse to the redundant clock pulse is effected only when synchronization is completed. This means that, in the event of disturbance of the slave clock pulse, the redundant clock pulse is synchronized to the disturbed clock pulse prior to the switchover and switchover is effected only when synchronization is completed. This has the advantage that no phase jump occurs at the instant of switchover. An existing connection is not interrupted. Following the switchover, the redundant clock pulse is synchronized to the master clock pulse and the disturbance is thereby remedied.

The redundant clock pulse is thus synchronized to the slave clock pulse prior to the switchover. At the instant of switchover, the redundant clock pulse and the slave clock pulse have the same frequency and the same phase.

Advantageous embodiments of the invention are disclosed by the dependent claims and by the following description.

BEST MODE FOR CARRYING OUT THE INVENTION

An embodiment example of the invention is explained below with reference to a FIGURE. The FIGURE shows a block diagram of a clock-pulse supply unit for a redundant clock pulse and a back panel. The clock-pulse supply unit for the slave clock pulse can be of a construction identical to that of the clock-pulse supply unit for the redundant clock pulse and, for reasons of clarity, is not depicted, the subracks of a digital transmission facility, e.g. a cross connect, likewise not being depicted for the same reason.

The clock-pulse supply unit comprises a first receiver unit D. The receiver unit D serves to tap from the back panel, which comprises the one bus for system clock-pulse distribution, the central system clock pulse supplied by the clock-pulse supply unit for the slave clock pulse. The receiver unit D has a control input through which it can be actively and passively switched. If the digital transmission facility is operating with the slave clock pulse, the receiver unit D is switched passively. If there is to be a switchover from the slave clock pulse to the redundant clock pulse, e.g. due to a disturbance of the slave clock pulse, the receiver unit D is switched actively. The receiver unit D then receives the central system clock pulse and relays this to a so-called phase-locked loop G, or PLL. The phase-locked loop G comprises a phase detector and a voltage-controlled oscillator. The oscillator generates the redundant clock pulse and is controlled through the phase detector. The phase detector has two inputs and one output. The central system clock pulse is applied to one of the inputs. The output delivers an output voltage which serves as a control voltage for the oscillator. Further components such as, for example, a loop filter, are optionally connected between the phase detector and the oscillator. The output of the oscillator is connected to the second input of the phase detector via a feedback loop. In this way, the phase of the redundant clock pulse is compared with the phase of the central system clock pulse. Located in the feedback loop is a feedback loop consisting of a transmitter unit E and a second receiver unit H. Supplied at the output of the transmitter unit E is a redundant clock pulse prepared in such a way that it can be applied directly, as a central system clock pulse, to the bus for system clock-pulse distribution. This prepared redundant clock pulse is supplied to the receiver unit H, in which it undergoes the same time delay as the tapped central system clock pulse in the receiver unit D. The receiver units D and H are of identical construction and serve to convert the specific system clock-pulse characteristics into oscillator clock-pulse characteristics. They comprise, for example, converters and level shifters. Both receiver units D and H are disposed at a short distance from one another and are located in a housing. As a result of this, temperature fluctuations, which can affect functionality, act equally on both receiver units and any negative effects thus cancel out one another upon comparison in the phase detector. In this way, two clock pulses are applied to the phase detector which have undergone the same phase delay and can thus be synchronized to one another without a phase jump. The redundant clock pulse is thus synchronized to the slave clock pulse. Following completion of synchronization, the switchover is effected from the slave clock pulse to the redundant clock pulse. At the instant of switchover, the redundant clock pulse and the slave clock pulse have the same frequency and the same phase. No phase jump occurs. The switchover can be effected on-line, i.e., without impairment of an existing connection.

The clock-pulse supply unit additionally comprises a changeover switch C and an artificial line B. The changeover switch C has one input and two outputs. The input is connected to the output of the transmitter unit E. One of the outputs of the changeover switch C is connected to the artificial line B, the other to the bus for system clock-pulse distribution. The changeover switch C has a control input through which the input of the changeover switch C can be optionally connected to either of the outputs of the changeover switch C. Prior to the changeover from the slave clock pulse to the redundant clock pulse, the input is connected to the artificial line B. The artificial line B is constructed, for example, of passive components and serves to simulate a real line of a bus for system clock-pulse distribution, with the same electrical parameters. In the simplest case, for example, the artificial line B is a 100 ohm resistance or an RLC element. Real conditions, including load, can thus be simulated by connecting the redundant clock pulse to the artificial line B via the transmitter unit E. The phase comparison in the phase detector can thus be effected under approximately real operating conditions. Following completion of synchronization, the switchover to the redundant clock pulse is effected by feeding the redundant clock pulse into the bus for system clock-pulse distribution A of the back panel via the changeover switch C. At the instant of switchover, there is no impairment of any kind due to the fact that the redundant clock pulse is prepared for a seamless transfer through phase comparison and feedback control, as well as bus simulation.

The clock-pulse supply unit furthermore comprises a divider L. The divider L is in the form of a frequency divider. The oscillator generates a redundant clock pulse at a frequency of, for example, 8 MHz. In the divider, which can also be in the form of a counter, for example, the redundant clock pulse is converted by, for example, a factor 4 into a clock pulse at 4 MHz. Following the switchover, this 4 MHz clock pulse is then supplied to the phase detector instead of the output signal of the receiver unit H. A reference clock-pulse changeover switch F is also provided for the selection of at least one reference clock pulse. Following the switchover, a reference clock pulse is supplied to the phase detector, via the reference clock-pulse changeover switch F, instead of the output signal of the receiver unit D. The reference clock pulse is, for example, the master clock pulse. The switchover from the slave clock pulse to the redundant clock pulse is effected in such a way that the clock-pulse edges are temporally congruent. The recovery time of the clock-pulse supply unit should be faster than the recovery time of the slave clock pulse, so as to achieve a pulling of the clock-pulse supply unit. When the switchover operation is initiated, the redundant clock pulse is first fed into the bus for system clock-pulse distribution in addition to the slave clock pulse. Only subsequently is the slave clock pulse removed from the bus. A rapid pulling of the phase-locked loop G is achieved in that a reference clock pulse with a frequency lower than that of the system clock pulse is supplied to the phase detector via the reference clock-pulse changeover switch F. The reference clock pulse is, for example, the master clock pulse. The reference clock-pulse changeover switch F is supplied with reference clock pulses which have been obtained from external interface signals. These are, for example, T3an (central network clock-pulse supply within a relay centre), the clock pulse of an SDH interface (STM1, STM4) and/or the clock pulse of a 2 Mbit/s G.703 interface (V5.X of a digital relay centre). Since a reference clock pulse might also fail, several reference clock pulses are supplied to the reference clock-pulse changeover switch F for selection.

The clock-pulse supply units for the redundant clock pulse and for the slave clock pulse are ideally of identical construction. In the event of a disturbance of the slave clock pulse, switchover to the redundant clock pulse is effected following synchronization. Following remedy of the disturbance, it is possible to switch back to the slave clock pulse. For example, a common open-loop control is provided comprising, for example, a processor which assumes control of the units in the clock-pulse supply units for the slave clock pulse and for the redundant clock pulse and effects the switchover. The processor is programmed accordingly. The open-loop control is effected as follows: in the case of an undisturbed slave clock pulse, the slave clock pulse is synchronized to the master clock pulse and, following a conversion, is supplied as the system clock pulse to the bus for system clock-pulse distribution. Reference signals from various interface cards can be used for fine adjustment of the slave clock pulse. In the case of a disturbed slave clock pulse, the redundant clock pulse is synchronized to the system clock pulse and then supplied to the bus for system clock-pulse distribution. The slave clock pulse is then removed from the bus for system clock-pulse distribution and the redundant clock pulse is synchronized to the master clock pulse. If the slave clock pulse is again undisturbed, it is first synchronized to the system clock pulse and then supplied to the bus for system clock-pulse distribution in addition to the redundant clock pulse. The redundant clock pulse is then removed from the bus and the slave clock pulse is synchronized to the master clock pulse. A switchover from slave clock pulse to redundant clock pulse or vice versa can also be effected from the control centre at any point in time.

What is claimed is:

1. Clock-pulse supply unit comprising:
 a phase detector for comparing the chase of a first clock pulse with the phase of a second clock pulse;
 a first receiver unit for receiving the first clock pulse and relaying the first clock pulse to the phase detector;
 a second receiver unit which has the same parameters as the first receiver unit and serves to receive the second clock pulse and relay the second clock pulse to the chase detector;
 an oscillator for generating the second clock pulse;

a transmitter unit connected between the oscillator and the second receiver unit in such a way that the second clock pulse generated in the oscillator is supplied to the second receiver unit via the transmitter unit; and a changeover switch with one input and two outputs, wherein the input of the changeover switch is connected to the output of the transmitter unit, and an output of the changeover switch is connected to an artificial line.

2. Clock-pulse supply unit according to claim 1, wherein the oscillator is a voltage-controlled oscillator whose control voltage is dependent on the output signal of the phase detector.

3. Clock-pulse supply unit comprising:

a phase detector for comparing the phase of a first clock pulse with the phase of a second clock pulse;

a first receiver unit for receiving the first clock pulse and relaying the first clock pulse to the phase detector;

a second receiver unit which has the same parameters as the first receiver unit and serves to receive the second clock pulse and relay the second clock pulse to the phase detector;

an oscillator for generating the second clock pulse;

a transmitter unit connected between the oscillator and the second receiver unit in such a way that the second clock pulse generated in the oscillator is supplied to the second receiver unit via the transmitter unit; and a divider connected between the oscillator and the phase detector, wherein the divider and the second receiver unit have a control input for active and passive switching of the divider and the second receiver unit.

4. Clock-pulse supply unit according to claim 1, wherein the first and the second receiver unit have the same time delay.

5. Clock-pulse supply unit comprising:

a phase detector for comparing the phase of a first clock pulse with the phase of a second clock pulse;

a first receiver unit for receiving the first clock pulse and relaying the first clock pulse to the phase detector;

a second receiver unit which has the same parameters as the first receiver unit and serves to receive the second clock pulse and relay the second clock pulse to the phase detector; and a reference clock-pulse changeover switch having an output connected to the output of the first receiver unit, wherein the reference clock-pulse changeover switch and the first receiver unit have a control input for active and passive switching of the reference clock-pulse changeover switch and the first receiver unit.

6. Clock-pulse supply unit according to claim 1, wherein the artificial line is suitable for simulation of a system clock-pulse bus.

7. Clock-pulse supply unit according to claim 1, wherein the first receiver unit is suitable for receiving a system clock pulse from a system clock-pulse bus, the changeover switch is suitable for switching the clock pulse received from the transmitter unit to the system clock-pulse bus, and the reference clock-pulse changeover switch is suitable for supplying to the phase detector at least one reference clock pulse, the frequency of which is lower than the frequency of the system clock pulse.

8. Clock-pulse supply unit according to claim 5, wherein the first receiver unit is suitable for receiving a system clock pulse from a system clock-pulse bus, the changeover switch is suitable for switching the clock pulse received from the transmitter unit to the system clock-pulse bus, and the reference clock-pulse changeover switch is suitable for supplying to the phase detector at least one reference clock pulse, the frequency of which is lower than the frequency of the system clock pulse.

* * * * *